United States Patent [19]
He

[11] Patent Number: 5,801,403
[45] Date of Patent: Sep. 1, 1998

[54] LOW DIVERGENCE LASER DIODE

[75] Inventor: Xiaoguang He, Tucson, Ariz.

[73] Assignee: Opto Power Corporation, Tucson, Ariz.

[21] Appl. No.: 832,646

[22] Filed: Apr. 4, 1997

[51] Int. Cl.[6] .................................................. H01L 33/00
[52] U.S. Cl. .................................. 257/94; 257/95; 257/96; 257/97; 257/98; 372/48; 372/49; 372/50; 372/99
[58] Field of Search ............................ 257/94, 95, 96, 257/97, 98; 372/49, 50, 48, 99

[56] References Cited

U.S. PATENT DOCUMENTS

| | | | |
|---|---|---|---|
| 4,028,146 | 6/1977 | Logan et al. | 148/171 |
| 4,176,325 | 11/1979 | Kajimura et al. | 331/94.5 H |
| 4,958,357 | 9/1990 | Kinoshita | 372/96 |
| 5,260,963 | 11/1993 | Baird et al. | 372/95 |
| 5,317,588 | 5/1994 | Kahen | 372/96 |
| 5,515,394 | 5/1996 | Zhang | 372/72 |
| 5,663,979 | 9/1997 | Marshall | 372/103 |

*Primary Examiner*—William Mintel
*Attorney, Agent, or Firm*—Herbert M. Shapiro

[57] ABSTRACT

The cavity of a laser diode is made longer than that which would be dictated by consideration of maximizing the efficiency of the diode. The lateral divergence of the emitted light beam is decreased as the cavity length increases. The lower lateral divergence enables the emitted light beam being focused to produce a greater depth of field for coupling into an optical fiber. In another case, when the fiber size is fixed, lower lateral divergence enables the emitted light beam to being fed into a lower numerical aperture fiber, or enables the beam divergence after fiber to be lower.

4 Claims, 2 Drawing Sheets

LOW DIVERGENCE LASER DIODE

FIELD OF THE INVENTION

This invention relates to laser diodes or diode arrays and more particularly to such diodes or diode arrays which emit a relatively narrow-divergence beam in the lateral direction.

BACKGROUND OF THE INVENTION

Semiconductor broad contact laser diodes, such as AlGaAs/GaAs; InGaAs/GaAs, and InGaAsP/GaAs laser diodes, are defined by a succession of layers formed on a substrate. Characteristic of such a diode is one or more quantum wells from the edge of which light is emitted. The light generated in the quantum wells is confirmed by waveguide layers which in turn are coated with cladding layers in a familiar laminar structure.

The divergences of the laser diodes are characterized by the full width at the half maximum (FWHM) of the beam intensity in the lateral (parallel to epitaxial plane) and transverse (perpendicular to epitaxial plane) directions. In the transverse direction, light is confined within micron order by the waveguide layers. Due to the small waveguide thickness dimension in this direction, light tends to propagate in a single mode and is relative stable to the excitation such as injection level, operation temperature and spatial hole burning. In the lateral direction, the light beam is outputted in a much larger (typical>10 µm) aperture for a broad contact laser diode. Light propagates in a multimode fashion in the lateral direction. The filamentation, due to self-focusing effect (Physics of Semiconductor Lasers, Bohdan Mroziewicz, Maciej Bugajski and Wlodzimierz Nakwaski, North Holland, 1991, p145) results in much smaller width of region (5–20 µm) through which the light is guided in the lateral direction. The lateral beam divergence is affected by the operational condition such as the injection level, temperature distribution within the cavity, crystalline uniformity, etc. as well as cavity geometry of the diode.

The cavity length of the laser diode has been chosen by maximizing the overall efficiency of the device. The differential quantum efficiency for a diode is given by:

$$\eta = \eta_i [1 + 2\alpha_i L / \ln(1/R_1 R_2)]$$

where $\eta$ is the internal quantum efficiency, $\alpha_i$ is the internal loss, L is the cavity length and R1 and R2 are the reflectivity of both facets. As shown in formula 1, a shorter cavity length will give better efficiency. However, too short a cavity (for example <500 µm) is not feasible because efficiency drop rapidly at the too short cavity length (D. Z. Garbuzov and V. B. Khalfin, Quantum well lasers by Peter S. Zory, Academic Press, 1993). In practice, cavity length is typically in the range of 500 to 1000 µm. The decrease of efficiency with increase of cavity length can be reduced by minimizing the internal loss $\alpha_i$ through proper device design (D. Z. Garbuzov, J. H. Abeles, N. A. Morris, P. D. Gardner, A. R. Triano, M. G. Harvey, D. B. Gilbert and J. C. Connolly, Photonic West, SPIE Proceedings, vol 2682, no. 20, 1996).

Low divergence is desirable in several applications, such as fiber coupling. The minimum focusing spot size of the light from diode is proportional to M factor of the beam. The M2 factor is proportional to the beam divergence and light emitting aperture. Therefore, the minimum focusing spot size is proportional to the beam divergence, in particularly, the lateral divergence, because M2 in the lateral direction is about two orders of magnitude higher than in the transverse direction for a typical 100 um wide aperture diode due to the two order higher in light emitting aperture. The lateral divergence determines the minimum diameter of a fiber to which light is to be coupled into. On the other hand, lateral divergence also determines the beam divergence after the fiber, when a fixed diameter fiber is used.

BRIEF DESCRIPTION OF THE INVENTION

In accordance with the principles of this invention, the cavity length, or longitudinal dimension of the diode, is made longer than that dictated by maximizing efficiency, to achieve lower lateral divergence. The invention is based on the realization that the lateral divergence of the output light beam is reduced as the cavity length increases while transverse divergence hardly changes with cavity length, and that the reduced lateral divergence is desirable in some application despite the reduced efficiency of the device which results from cavity lengthening.

DETAILED DESCRIPTION OF AN ILLUSTRATIVE EMBODIMENT OF THIS INVENTION

Figure 1:
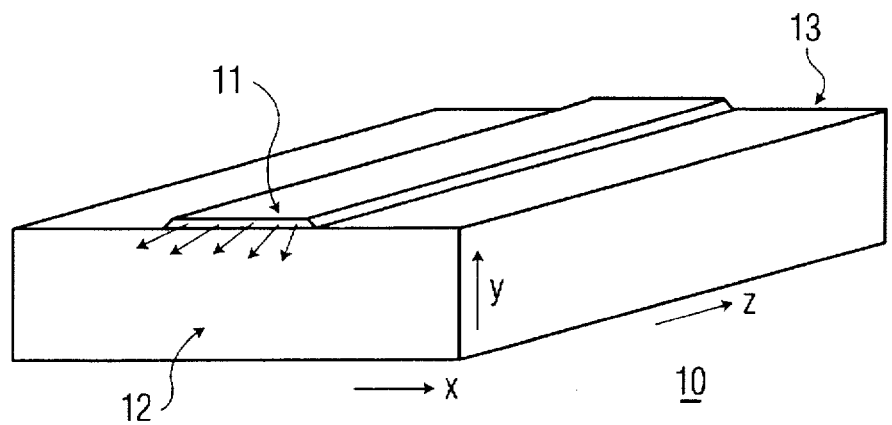
FIG. 1 is a schematic representation of a laser diode structure.

FIG. 1 shows a laser diode 10 with a laser facet 11 formed at the top surface.

The diode is formed by a succession of layer in a well understood manner, a description of which is not necessary for an understanding of the present invention. Suffice it, to say, that the diode is, for example, an indium gallium arsenic (InGaAs) diode where the emitting facet has a lateral dimension along the x axis as represented by the arrow designated x, a transverse dimension along the y axis as represented by the arrow designated y and a longitudinal dimension along the z axis as represented by the arrow designated z in the figure. The cavity length is defined along the z axis as represented by the arrow designated z in the figure.

Figure 2:
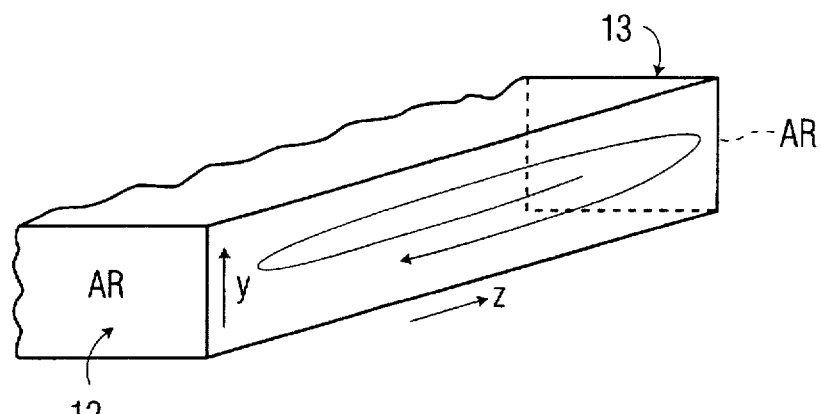
FIG. 2 is a schematic representation of a portion of the structure of FIG. 1, and FIGS. 3 and 4 are graphical representations of lateral beam divergence from the diode structure of FIG. 1.

The front facet 12 and the rear facet 13 of the cavity are coated with anti reflective (AR) and high reflective (HR) coatings, respectively, in the usual fashion as indicated in FIG. 2. Light generated by the light-emitting facet circulates between the front and rear facets of the cavity, reflected internally by the facet coatings with an efficiency which is a function of the absorption in the cavity, cavity length and the reflectivity of the facet coatings employed as is well known.

Figure 3:
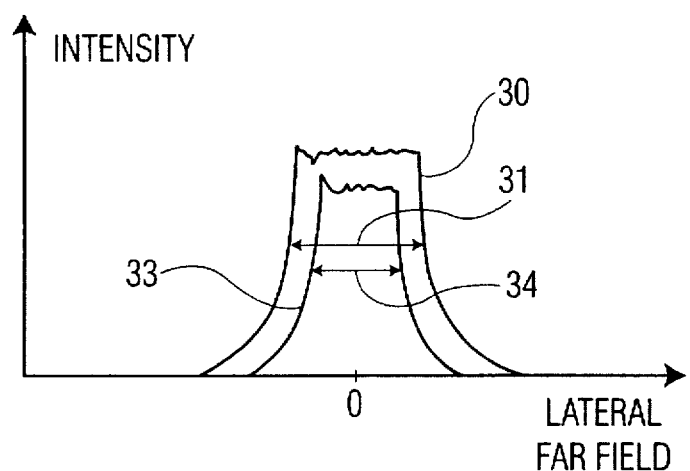

FIG. 3 is a graphical representation of the lateral beam divergence as a function of cavity length. For a cavity length dictated by considerations of maximizing efficiency, the lateral beam divergence is represented by curve 30 having a width 31. For a cavity length longer than that dictated by considerations of maximum efficiency, the lateral beam divergence is represented by curve 33 having a width 34, smaller than that of curve 30.

The following equation defines Ln which represents the mirror loss as a function of the reflectivity of the mirror at the opposite ends of a resonant cavity.

$$\alpha_m = -\frac{1}{2L} \ln\left(\frac{1}{R_1 R_2}\right)$$

Where L is the cavity length and R and R are the reflectivities of the two mirrors. It is clear from FIG. 3 that the shorter the cavity, the higher the efficiency as long as leakage is avoided (at very short lengths). Typically, cavity length according to efficiency considerations is between 500 and 1000 μm.

Figure 4:
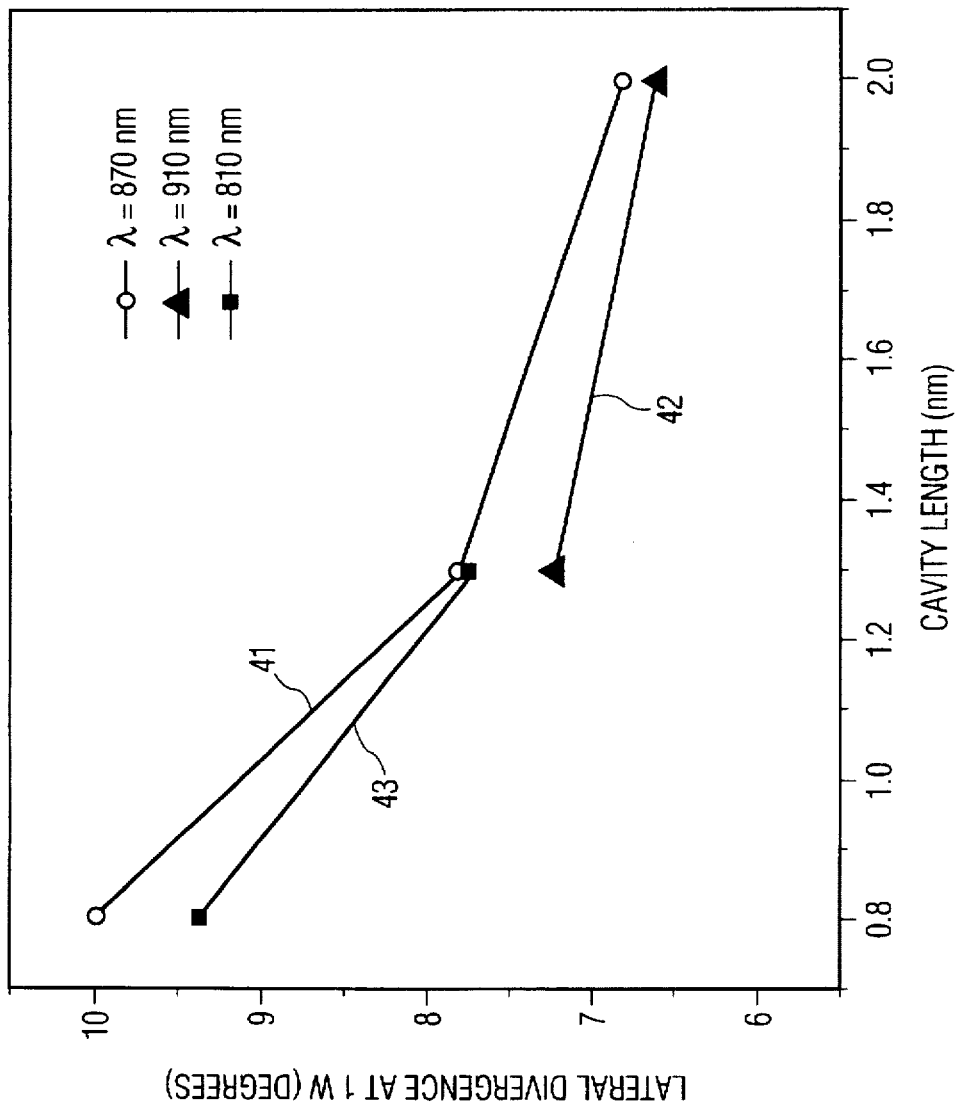

FIG. 4 is a plot of lateral divergence at one watt (in degrees) verses cavity length in millimeters (mm) for wavelengths λ of 870 nm, 910 nm, and 810 nm represented by curves 41, 42, and 43 respectively. The lateral divergence can be seen to decrease for longer cavity lengths. For coupling into an optical fiber, the decrease in lateral divergence results in a greater depth of field which more than compensates for the loss of efficiency which occurs for longer cavity length when the loss output is coupled into an optical fiber. Cavity length of 1500 μm to 2000 μm have been found to provide the much more than compensating coupling desired even though the cavity lengthening resulted in reduced efficiency.

What is claimed is:

1. Apparatus comprising a laser diode having an emitting facet, said apparatus including an optical fiber having an end coupled to said facet, said diode having defined therein a resonant cavity having front and rear faces, said faces having a partially reflective and an anti-reflective coating thereon respectively, said cavity having a calculable length Lm equal to a length for maximum efficiency and having an associated depth of focus said cavity having an actual length greater than Lm which said efficiency is lower than that at which a maximum efficiency occurs and said depth of focus is longer than said associated depth of focus.

2. Apparatus as in claim 1 wherein said diode has the actual cavity length from 1000 μm to 2000 μm.

3. Apparatus as in claim 1 wherein said diode comprises AlGaAs/GaAs, InGaAs/GaAs or InGaAsP/GaAs.

4. Apparatus as in claim 2 wherein said diode comprises AlGaAs/GaAs, InGaAs/GaAs or InGaAsP/GaAs.

* * * * *